United States Patent

Tsuchiaki

[19]

[11] Patent Number: 5,963,789
[45] Date of Patent: Oct. 5, 1999

[54] METHOD FOR SILICON ISLAND FORMATION

[75] Inventor: Masakatsu Tsuchiaki, Tokyo, Japan

[73] Assignee: Kabushiki Kaisha Toshiba, Kawasaki, Japan

[21] Appl. No.: 08/676,412

[22] Filed: Jul. 8, 1996

[51] Int. Cl.⁶ .............................. H01L 21/76; H01L 21/44
[52] U.S. Cl. .............................. 438/62; 438/52; 438/355; 438/410; 257/513
[58] Field of Search .................................. 438/107, 109, 438/128, 221, 222, 275, 296, 404, 405, 413, 424, 479, 481, 52, 62, 355, 410; 148/DIG. 50; 251/513

[56] References Cited

U.S. PATENT DOCUMENTS

| | | |
|---|---|---|
| 4,264,382 | 4/1981 | Anantha et al. . |
| 4,361,600 | 11/1982 | Brown . |
| 4,485,551 | 12/1984 | Soclof . |
| 4,502,913 | 3/1985 | Lechaton et al. . |
| 4,533,430 | 8/1985 | Bower ...................... 438/424 |
| 4,551,743 | 11/1985 | Murakami ................. 257/513 |
| 4,561,932 | 12/1985 | Gris et al. . |
| 4,604,162 | 8/1986 | Sobczak . |
| 4,611,387 | 9/1986 | Soclof . |
| 4,615,746 | 10/1986 | Kawakita et al. ....................... 438/355 |
| 4,661,832 | 4/1987 | Lechaton et al. . |
| 4,692,994 | 9/1987 | Moniwa et al. . |
| 4,763,183 | 8/1988 | Ng et al. . |
| 4,814,287 | 3/1989 | Takemoto et al. . |
| 4,845,048 | 7/1989 | Tamaki et al. . |
| 4,874,718 | 10/1989 | Inoue . |
| 4,925,805 | 5/1990 | van Ommen et al. . |
| 4,933,298 | 6/1990 | Hasegawa . |
| 5,028,549 | 7/1991 | Chang et al. . |
| 5,061,655 | 10/1991 | Ipposhi et al. . |
| 5,128,732 | 7/1992 | Sugahara et al. . |
| 5,264,721 | 11/1993 | Gotou . |
| 5,270,265 | 12/1993 | Hemmenway et al. . |
| 5,365,081 | 11/1994 | Yamazaki et al. . |
| 5,405,454 | 4/1995 | Hirai et al. . |
| 5,426,070 | 6/1995 | Shaw et al. ............................... 438/52 |
| 5,440,161 | 8/1995 | Iwamatsu et al. . |
| 5,445,107 | 8/1995 | Roth et al. . |

OTHER PUBLICATIONS

IBM technical disclosure bulletin vol. 26#Feb. 9, 1984.
Formation of Silison Nitride at a Si–SiO2 interface . . . E. Kooi Electrochemical society V123/ Jul. 7, 1976.

*Primary Examiner*—Charles Bowers
*Assistant Examiner*—David S. Blum
*Attorney, Agent, or Firm*—Banner & Witcoff, Ltd.

[57] ABSTRACT

A method is disclosed of manufacturing improved device structures which include a device structure having STI and a thin foot charge drain beneath the device area on an inexpensive bulk silicon substrate. The structures retain high speed operation of SOI devices without any adverse effects of charge build-up and floating effects as observed in conventional SOI devices, and, furthermore, are constructed without any extra process steps added to the conventional STI technology except for an isotropic etching step. The invention also contemplates construction of multi-level electronic circuit. In various embodiments, the invention includes steps of forming a photoresist pattern over a semiconductor substrate to designate a plurality of islands, anisotropic etching the substrate to form plurality of designate islands which develops thin passivation layer on the sidewall, performing successively an isotropic etching on the resulting structure to create a thin foot region under each of the plurality of the islands with the help of the passivation layer, and forming a thin thermal oxide layer to improve the interface quality between each thin foot region and the insulator. Additional layers of silicon islands may be formed on the resulting structure.

19 Claims, 10 Drawing Sheets

METHOD FOR SILICON ISLAND FORMATION

BACKGROUND OF THE INVENTION

1. Field of the Invention

The present invention relates to a method of forming silicon structures in semiconductor substrates for electronic device fabrication. More particularly, the invention provides a structure and method for fabrication of multi-layer electronic circuits including Metal Oxide Semiconductor Field Effect Transistors (MOSFETS) in any part of the bulk silicon wafer with reduced capacitance to the substrate without adverse effects of hot carrier charge build-up and floating body effects observed in conventional silicon-on-insulator (SOI) devices.

2. Description of the Related Art

Silicon-on-insulator (SOI) devices have numerous advantages for Very Large Scale Integration (VLSI) of electronic devices over conventional microelectronic circuit fabrication on bulk silicon substrate (Bulk devices). Because SOI devices are fabricated on thin silicon film on insulator, the parasitic capacitance of the source and/or drain of MOSFET to the substrate below is greatly reduced. Faster operation speed compared to bulk devices is thus assured.

The insulator on which the SOI devices are formed also changes the electric field distribution around the source/drain region and alleviates "short channel effects" (i.e. lowering of the threshold voltage of MOSFET with reduction of the channel length) which causes severe challenges for scaling down and high density packing of bulk MOSFET devices in a single chip. Additionally, device isolation of the SOI devices can be easily achieved with Shallow Trench Isolation (STI) techniques by simply etching off unnecessary parts of silicon film surrounding areas to be used for SOI devices (Active Area).

Problems to be solved

SOI substrates on which SOI devices are to be formed are generally difficult to manufacture and thus expensive compared to conventional bulk silicon substrates. In fierce competition for cost reduction of semiconductor device manufacturing, this is a great disadvantage for SOI devices. Furthermore, SOI devices have inherent drawbacks due to build-up of hot carrier generated during device operation.

During MOSFET operation, from time to time, a high electric field concentrates around the drain region. Electric carriers (i.e., electron or hole) flowing in the channel of the MOSFET are accelerated by the strong electric field around the drain and generates the opposite electric carriers (i.e., hole or electron) by impact ionization which then flows back to the body of the device. Because the SOI device is completely isolated electrically from the substrate below, the created carriers cannot be drained into the substrate and thus build up in the body of the SOI device. This is not the case for bulk devices which have an electrical path to drain carriers into the silicon substrate below. Again, because the body of the SOI device is electrically isolated, the build-up of electrical charge causes floating body effects, i.e., a shift of electrical potential in the body of SOI device with the carrier build-up. This floating body effects then induces undesirable transition in device performance such as a change of threshold voltage with time. When the build-up of the carrier in the body is large enough to apply a forward voltage between source and the body and to force forward current to flow through junction between the source and body, another electrical path away from the gate electrode is formed (parasitic bipolar action). Once this electrical path is formed, the electrical current can no longer be controlled by the gate electrode and the device becomes disabled.

FIG. 1A shows schematically a conventional n-MOSFET device in which electrons move from source to drain. Impact ionization of a hole near the drain, its flow back into the body of the MOSFET, and eventual draining to the substrate are depicted as well.

FIG. 1B shows a corresponding SOI n-MOSFET. Holes generated near the drain flow back into the substrate. However, for these holes, no draining path down to the substrate is available through the insulating oxide layer below. Holes are confined inside the SOI device body. Eventually forward voltage is applied between source and the body. Holes in the body start to flow in the source and electrons flow out of the source forming parasitic bipolar action path. With this new electron current path formed away from gate electrode besides proper channel current path at the interface between silicon and gate oxide, the SOI device shows unexpected irregular operation (a so-called "kink effect").

U.S. Pat. No. 4,763,183 to Ng et al discloses an SOI device which includes an electrically conductive pathway extending from an active area through or around the insulating region to a non-active region of the substrate. The device and its related method of manufacturing alleviate the kink-effects caused by charge accumulation. However, the process for forming the device structure requires numerous complicated steps.

Moreover, the structure and formation of the electrically conductive pathway are not satisfactory for deep sub-micron scale device fabrication. The pathway around the insulating region is apparently only attainable by sacrificing high density packaging capabilities of the electronic circuits, which is a foremost important requirement for ULSI fabrication. On the other hand, formation of electrical pathways through the insulating material requires process steps to open a small hole through the insulating region whose dimensions become less than 0.25 mm in the deep sub-micron device era (if the hole is large compared with the insulating region, the device loses advantages of SOI device). Formation of such small holes precisely aligned within the insulating region whose dimensions are less than 0.25 mm is extremely difficult and almost impractical as a ULSI manufacturing method. Furthermore, the method requires a crystallization step even for constructing a single level planar circuit which is inefficient when a single crystal plane is already available on the original substrate surface.

Accordingly, there is a need for improved devices structure and a simple fabrication method which realize high speed operation as with the conventional SOI devices but without any adverse effects related to the charge build-up and higher manufacturing cost incurred by complicated processing and expensive substrate.

SUMMARY OF THE INVENTION

In consideration of the above-mentioned problems, the present invention provides a improved device structure and very simple method for realizing high speed electronic devices having very small parasitic capacitance with the substrate. The invention includes the formation of a thin-foot charge drain beneath the conventional SOI structure to sweep out undesirable charge build up generated by hot carrier effects during device operation.

In various embodiments, the invention includes process steps of anisotropic etching of a bulk silicon substrate with a patterned mask layer on it using Reactive Ion Etching (RIE) in order to delineate active regions and to create a plurality of silicon islands on the surface of the substrate. A passivation layer is formed on sidewalls (i.e., vertical surface produced during vertical silicon RIE) of each island. Preserving the passivation layers, an isotropic etching step is performed to preferentially remove the bottom portions of each island while the sidewall is protected by the passivation layer, thus forming a "pinch-off" or thin foot region under each island.

After removing the passivation layer, a thermal oxidation process is performed, providing an improved interface with less charge traps around the each silicon island and thin foot beneath it. Each thin foot region acts as a drain for charges from the device while the "pinch-off" ensures reduced electric coupling between devices to be formed on the surface of silicon island and bulk silicon substrate below which is connected only through thin foot. Besides the isotropic etching step, the oxidation step of the silicon islands and thin foot regions can be also utilized to control the thin foot width and to tailor its conductance to the substrate. After filling up the trenches around-the silicon islands with insulating material and formation of silicon layer on it, similar steps described above can be repeated and additional device structures can be fabricated on the previous devices.

Various objects and advantages of the present invention will become apparent through the following detailed description, figures, and the appended claims.

DESCRIPTION OF THE PREFERRED EMBODIMENTS

Figure 1A:
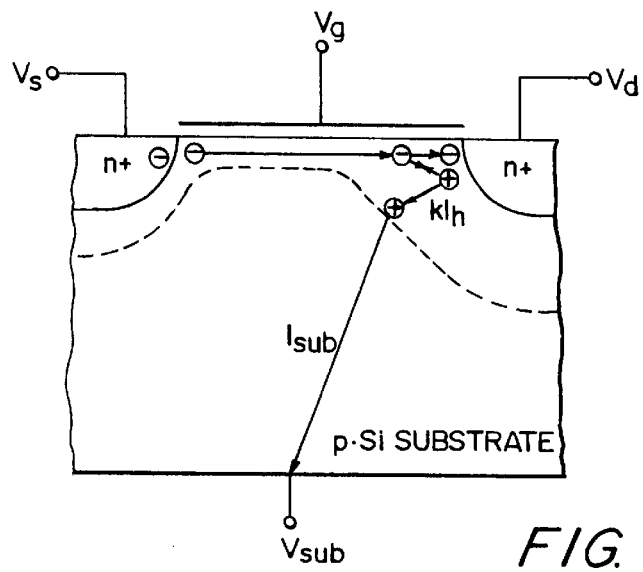
FIG. 1A shows a cross section of a conventional n type bulk MOSFET and an electrical current path of holes generated by impact ionization near the drain.
Figure 1B:
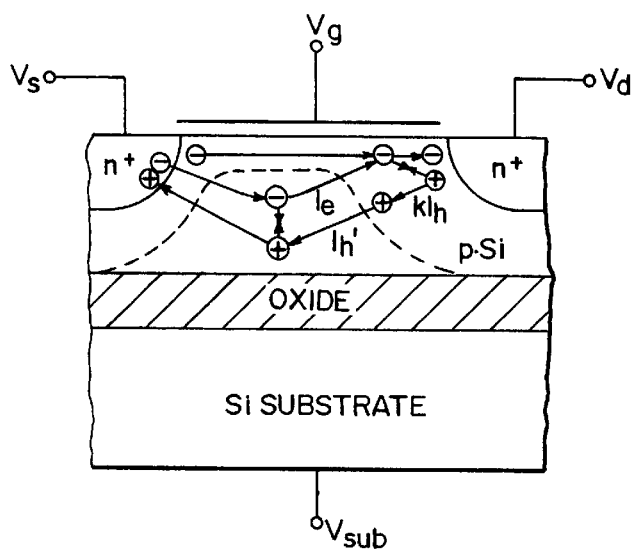
FIG. 1B shows a cross section of a conventional n type SOI MOSFET and an electrical current path of holes generated by impact ionization near the drain together with an another electron path created by flowing back of the holes into source region (bipolar action).
Figure 1C:
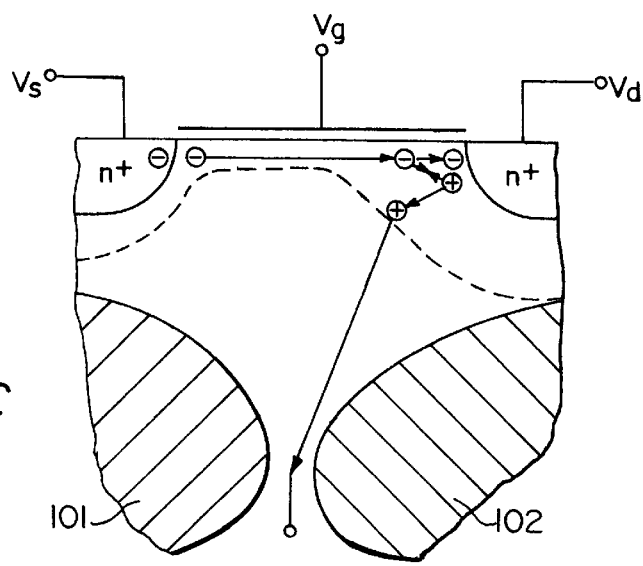
FIG. 1C shows a cross section of the improved n type MOSFET structure incorporating a "thin foot" region 101 which provides a conductive pathway to a substrate.

FIG. 1C shows schematically a device structure incorporating various principles of the present invention. As shown in FIG. 1C, a thin foot charge drain region 101 under a MOSFET structure provides a conductive pathway through insulator region 102 down to the silicon substrate. Here, it should be noted that, in realistic device structures where device length is generally greater than device width, the pinch-off to be formed along the "width direction" rather than along the "length direction" (i.e., direction of channel current) may be determinant. Thus, FIG. 1C should be understood as illustrative to explain the principles of the present invention.

Although not specifically shown in FIG. 1C, surfaces of the thin foot region have been oxidized and the resulting thin thermal oxide layer between the thin foot region 101 and surrounding insulator provides a high quality interface between silicon of the thin foot and the oxide suppressing charge traps and interface states which might impair the ability of the thin foot as a charge drain. The method for forming the structure shown in FIG. 1C is described in more detail below.

Resistance Requirements of the Thin Foot Region

Figure 1D:
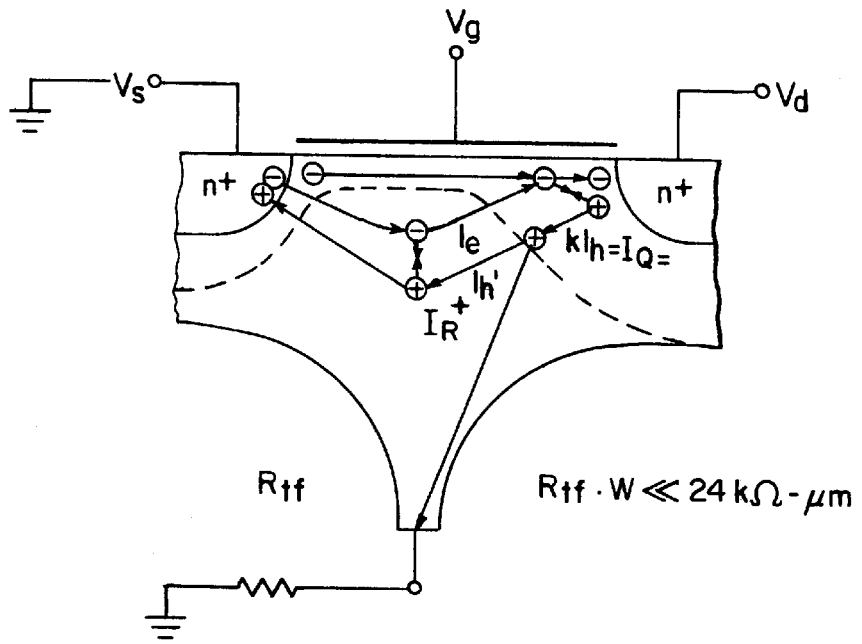
FIG. 1D explains a circuit model for two competing current paths for the holes generated near the drain region. In order for the current path flowing through the thin foot region to be effective against the current path flowing into the source region, the resistance of the region Rtf must be below the value indicated in the figure.

Requirements for the thin foot region to be an effective charge drain will first be explained. FIG. 1D shows possible current paths in the device structure described in FIG. 1C. As shown in FIG. 1D, holes created by the impact ionization process of the electrons flowing through high electric field region around the drain are swept away from the drain into the body of the device due to the electric field around the drain. These holes could either flow into the source region inducing the electron flow from the source (bipolar action) or drain out down to the silicon substrate.

The amounts of hole current flowing through these two competing paths are determined by the resistance (or conductance) of the each current path. In order for the latter current path through the thin foot region to be effective or competitive against the former current path (i.e., to suppress anomalous action of the device), the resistance of the thin foot region should be low. Because the amount of holes generated at the drain region is proportional to the device width, the wider the device width, the lower the thin foot resistance should be. Hence, the empirical upper limit for the thin foot resistance imposed by the requirement that the current path through thin foot region should be effective enough to suppress anomalous kink-effect of the device has the following form. The formula was derived by various computer simulations:

$$R_{tf} * W < 24 \text{ k}\Omega\mu m,$$

Where $R_{tf}$ is the resistance of the thin foot region.

Figure 1E:
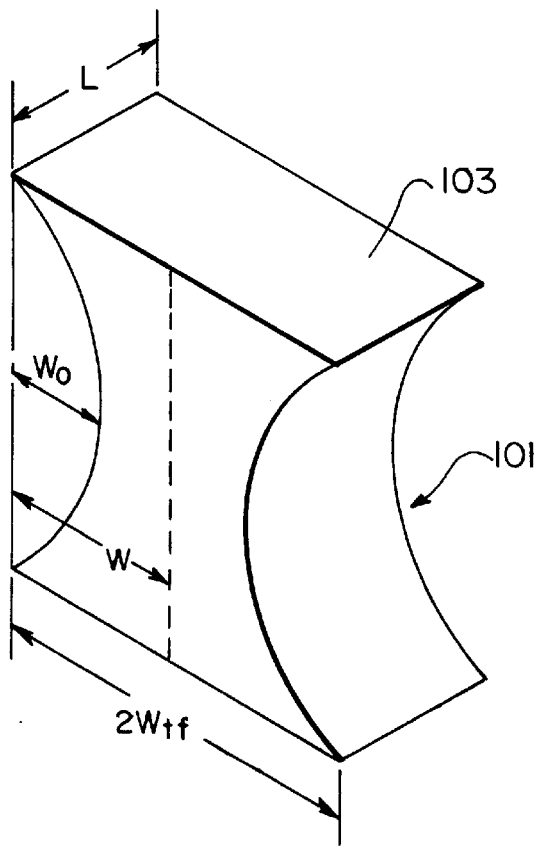
FIG. 1E shows dimensional parameters associated with the thin foot region.

Referring now to FIG. 1E, the relationship between physical parameters of the thin foot region 101 and its resistance will be explained. As shown in FIG. 1E, the thin foot region is modeled as a brick with semi-circular portions removed from both sides. The physical structure of the thin foot region is then characterized by a top width of the region, a width of the narrowest portion of the thin foot, $2(W_{ft}-W_0)$, and length of the thin foot, L. Resistance of this structure for the electrical current flowing from top to bottom is expressed by the following formulas.

$$R_{tf} = 2\rho \int_0^{w_o} \frac{ds}{2L(W_{tf} - \sqrt{W_0^2 - S^2})}$$

$$= \frac{\rho}{L}\left[\frac{2\alpha}{\sqrt{\alpha^2-1}}\tan^{-1}\left(\frac{\sqrt{\alpha+1}}{\sqrt{\alpha-1}}\tan\frac{\pi}{4}\right) - \frac{\pi}{2}\right]$$

$$= \frac{\rho}{L}F\left(\frac{W_0}{W_{tf}}\right) \quad \text{where } \alpha = \frac{W_{tf}}{W_0}$$

where $\rho$ is resistivity of the thin foot material. Now, the constraint, $R_{tf}*W<24$ k$\Omega\mu$m, can be expressed in terms of the physical parameters of the thin foot region.

$$\left(\frac{W}{L}\right)F\left(\frac{W_0}{W_{tf}}\right) \leq \frac{24K\Omega\mu m}{\rho}$$

If one assumes $L>W_{tf}$ and substrate doping of $10^{16}$ cm$^3$ (i.e., resistivity of 1$\Omega$ cm), $(W_0/W_{ft})<0.8$ is obtained. Of course, with higher doping levels (i.e., lower resistivity), this upper limit goes much higher. In various embodiments with substrate doping of $10^{16}$ cm$^3$ or higher, even the narrowest width of the thin foot region as thin as 20% of the device width is wide enough in terms of resistance to assure the capability of the thin foot as an effective charge drain.

Detailed Process Steps For One Embodiment

FIGS. 2A through 2E show steps used in embodying a device structure of the invention as seen in a cross-sectional view.

Figure 2A:
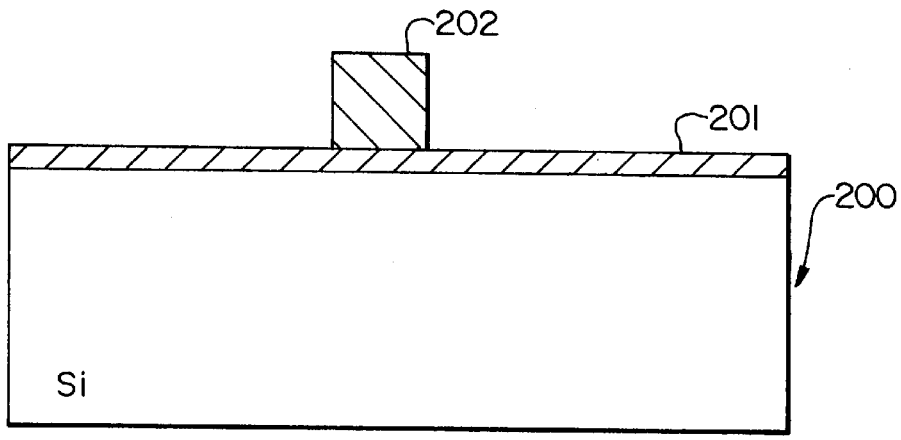
FIG. 2A shows a first step of forming a silicon nitride layer 201 and a photoresist pattern 202 on a silicon substrate.

First, as shown in FIG. 2A, a silicon nitride film 201 about 2000 A thick is deposited on a silicon substrate 200 using a Chemical Vapor Deposition (CVD) technique. Thereafter, a photoresist film is applied and patterned resulting a photoresist mask 202, which has the intended width and length to be transferred to the silicon substrate below as dimensions of the active area.

Figure 2B:
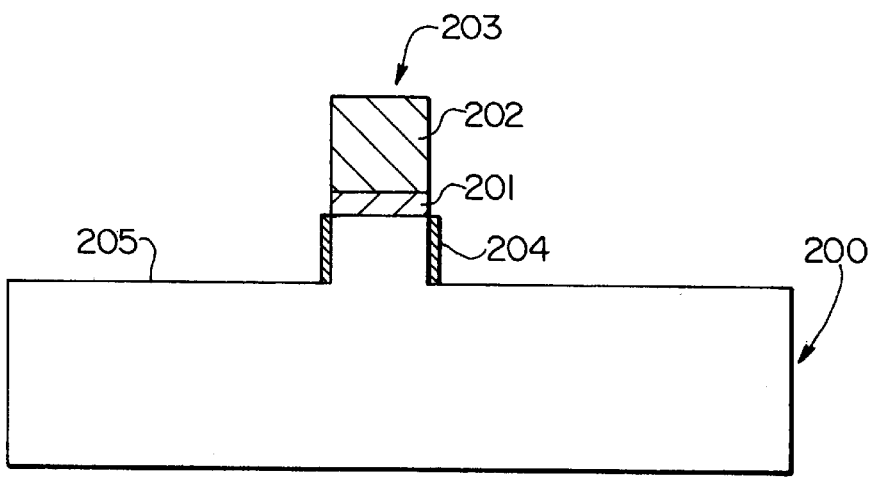
FIG. 2B shows a further step of performing a reactive ion etching (RIE) process to create a silicon island with thin passivation layer on its sidewalls.

Next, referring to FIG. 2B, a reactive ion etching (RIE) process is performed which anisotropically (i.e., vertically) etches the silicon nitride layer 201 and the underlying silicon substrate 200, creating a silicon surface 205, and leaving a silicon island structure 203. Resulting trenches will be used for a part of STI processes. In various embodiments, RIE process with plasma from NF3 feeding gas may be used. Plasma voltage of about 300 V at 45 mTorr may be sufficient for the etching. The depth of the etching depends on the design of the electronic circuit to be fabricated on the silicon surface. For an electronic circuit of 0.25 mm groundrule, etching depth of 0.25 mm would be enough for the electrical isolation between the devices.

During the etching process, thin passivation layers 204 are formed on the sidewalls i.e., vertical planes of the island structure because the vertical planes are free from ion impingement. On the other hand, at the horizontal bottom surface of the substrate 205, ions impinging vertically from plasma onto the substrate prevent the formation of passivation layers on this surface. For example, the photoresist mask on the upper surface of the projection is exposed to the impinging ions and chemically active species from the plasma, resulting in the release of some of its carbon containing materials into plasma. These carbon containing materials then deposit on the vertical surface of the substrate which is free from the ion impingement while carbon material deposited on the horizontal surface of the substrate is sputtered off by the ions. Needless to say, carbon contents in the feeding gas of the plasma also serve as a source of the passivation layer if one employs plasma generated from gases such as CF4 and CF3.

Figure 2C:
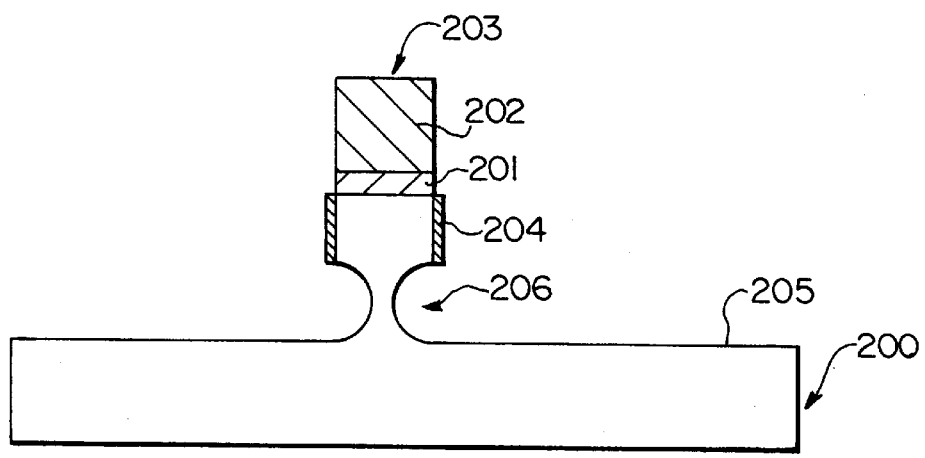
FIG. 2C shows a further step of performing isotropic etching, resulting in the formation of a "pinch-off" or "thin foot region" 206 under the silicon island.

Thereafter, as shown in FIG. 2C, an isotropic dry etching process is performed. For this step, an isotropic etching method such as a Chemical Dry Etching (CDE) technique can be used. Under this technique, plasma is generated in an isolated location from the substrate and chemically active species are extracted from the plasma and are guided to the substrate. Because the substrate is not directly exposed to the plasma, there is no ion impingement on the substrate. Only an isotropic chemical etching by the species chemically activated in the plasma phase proceeds on the substrate.

Plasma generated from a CF4/O2 gas mixture with applied power of 700 W may serve for the production of chemically active species which are guided to the substrate held at T=25 C under 40 Pascal. Even though the passivation layer formed at the previous RIE step is very thin (less than 50 A), it has been found that the layer is very resilient against isotropic etching by the chemically active species and serves well as a protective layer of the sidewalls. The horizontal bottom surface 205 has no passivation layer on it while the vertical sidewalls are protected by passivation layers 204.

Isotropic etching erodes the bottom surface 205 and starts encroaching into the foot of the silicon island 203, eventually resulting in the creation of a thin foot region 206 and additional removal of the silicon substrate 200. In this regard, it is preferable to keep the photoresist mask used in the previous RIE step until this step, because its removal by oxygen plasma may also cause stripping of the passivation layers 204 whose main ingredients are believed to be carbon.

It should be noted that, by using the passivation film 204 inevitably formed on the vertical planes during the RIE process (as explained earlier, even in the carbon free plasma such as NF3 develops passivation film on the sidewall), there is no need for additional process steps to apply a further protective layer and to etch it off selectively on the horizontal surface to leave only vertical surfaces protected by the layer. Sequential processing of RIE and CDE (i.e., performing anisotropic etching and isotropic etching back to back) eliminates any additional process steps to realize the thin foot structure. Furthermore, applying CDE after RIE step removes the damaged layer on the horizontal bottom surface 205 caused by ion bombardment. Therefore, detrimental effects of the RIE damage are avoided either when it is to be used as a bottom surface of the STI or in case it is intended for new active area of electronic devices. Needless to say, any isotropic etching step which features the above virtues of CDE (i.e., selectivity against passivation layer formed during RIE) can be used instead. The thin foot thus formed provides an electrical pathway through which excess charge in the device body to be formed on the silicon island 203 will be swept away down to the substrate 200.

The width of the thin foot is tailored by controlling the isotropic etching time in accordance with the requirements on the resistance of the thin foot region as explained earlier. For example, 0.25 mm device width and substrate doping higher than $10^{16}$ cm$^{-3}$ narrowest thin foot width of 400 A is enough to ensure smooth draining of the hot carrier charge. Of course, further fine tailoring of the width of the thin foot region is available at the oxidation step in the later stage.

Figure 2D:
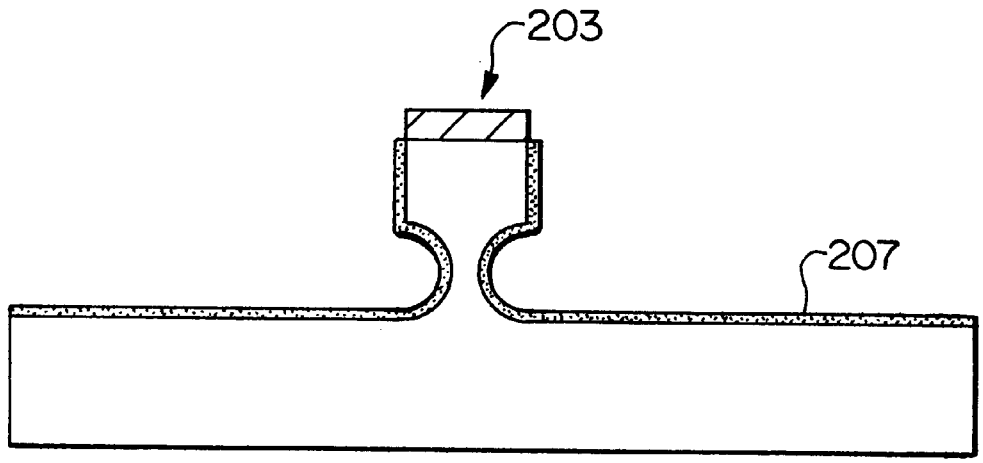
FIG. 2D shows a further step of performing a thermal oxidation on the structure resulting from FIG. 2C after the photoresist and the passivation film removal. Thin thermal oxide film grows on the silicon surfaces surrounding the thin foot region and island sidewalls creating a high quality silicon/oxide interface.

Next, as shown in FIG. 2D, photoresist mask 202 and the passivation layer 204 are removed using, for example, oxygen down-flow plasma. Wet cleaning with a solution such as H2SO4 and H2O2 mixture cleans up any residue. Then the substrate is oxidized, for example, in dry oxygen ambient at 1000 C. A thin thermal oxide film 207, for example 100 A thick, grows on the exposed silicon surface. As explained earlier, this oxidation step can be used for fine tuning the thin foot width by adjusting the oxidation time (i.e., amount of silicon consumption at the thin foot region). Dry oxidation conditions are generally preferable for this step because progress of the oxidation reaction is well controlled under these conditions and they provide high quality oxide/silicon interface with little charge traps and interface states which obstruct smooth electric charge transport through the thin foot region and induce unexpected charging of the interface.

Figure 2E:
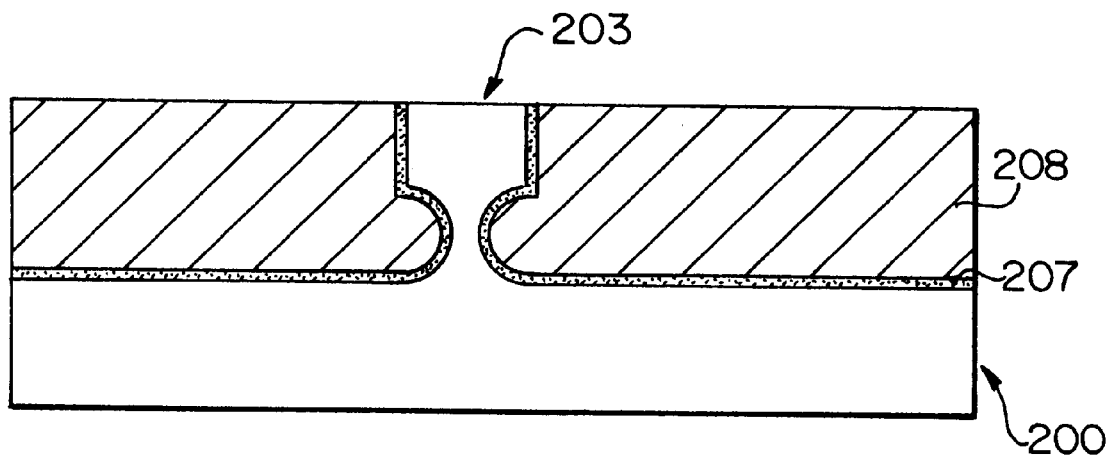
FIG. 2E shows further steps of filling and planarization over the structure of FIG. 2D resulting in the filled up peripheral area with CVD oxide.

FIG. 2E shows the structure after further steps of filling the peripheral region of the silicon island 203 and thin foot region 206 by depositing oxide film 208 with, for example, a Chemical Vapor Deposition (CVD) method, followed by a planarization step to remove excess oxide film on the silicon island employing, for example, a Chemical Mechanical Polishing (CMP) technique. During this step, remaining nitride film 201 serves as a pad against the polishing. After the polish, it is removed by hot phosphoric acid. The region filled with CVD oxide 208 up to the silicon surface serves for STI of the devices to be formed on the silicon island 203. Thin foot 206 provides an electrical current path for the excess charge to be drained down to the silicon substrate 200. The pinching-off, i.e., incursion of low dielectric constant material, namely CVD oxide 208, under the silicon island 203 assures less electrical coupling between electronic devices to be formed on the silicon island and substrate below. Any electronic device can be fabricated on the silicon island 203 using state-of-the-art planar device fabrication techniques available because the wafer surface is aligned on a single plane. A device structure with STI, reduced coupling to the substrate, therefore faster operation speed, and the thin foot charge drain, therefore no kink effects, is thus realized on the inexpensive bulk silicon substrate without any extra process steps added to the conventional STI technology except for the isotropic etching which could be performed immediately after the RIE step.

Application I: SOI DRAM Array On Bulk Substrate With Charge Drain

Reference will now be made to FIGS. 3A through 3G, which show how the inventive principles can be applied to realize SOI DRAM device structures with thin foot charge drain regions on inexpensive bulk silicon substrate.

Figure 3A:
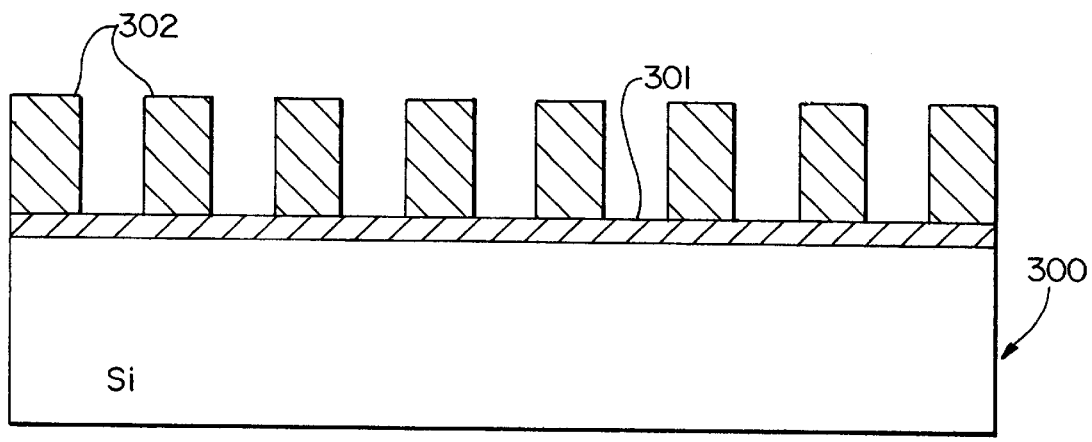
FIG. 3A shows first steps of forming a silicon nitride layer and photoresist masks to designate a plurality of silicon islands to create, for example, a DRAM array with improved device structure including thin foot charge drains.

In FIG. 3A, a silicon nitride layer 301 is applied to a silicon substrate 300. Thereafter, a photoresist layer is applied and patterned to form RIE mask patterns 302, corresponding to designated active areas. Widths of the openings and the mask patterns are, for example, 0.25 mm under quarter-micron groundrule.

Figure 3B:
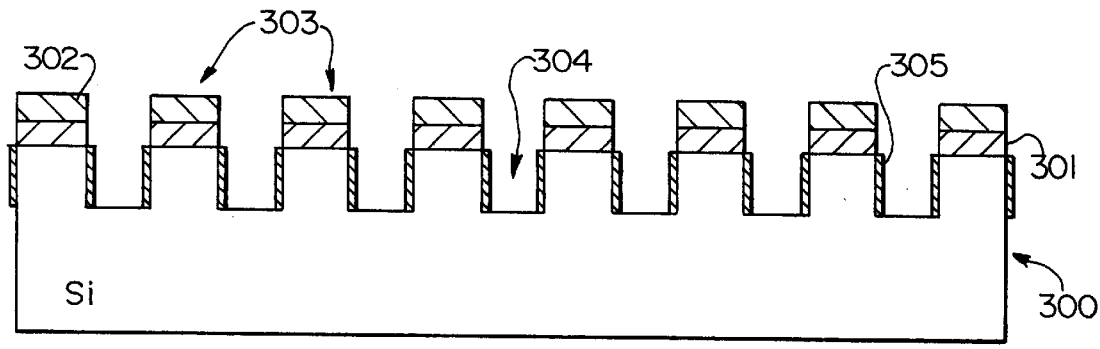
FIG. 3B shows a second step of anisotropically etching the structure depicted in FIG. 3A leaving silicon islands 303 with the silicon nitride pad 301 and remaining photoresist patterns 302 on them. Thin passivation films 305 develop on the sidewalls of the islands.

Subsequently, as shown in FIG. 3B, anisotropic etching is performed to remove vertical portions of the silicon substrate, leaving islands 303 with silicon nitride pad 301 and remaining photoresist patterns 302 on them. The depth of the resulting trenches 304 is, for example, 0.25 mm. As described with reference to FIG. 2B, an RIE etching process can be used for this step. Thin passivation films 305 develop on the sidewalls of the islands.

Figure 3C:
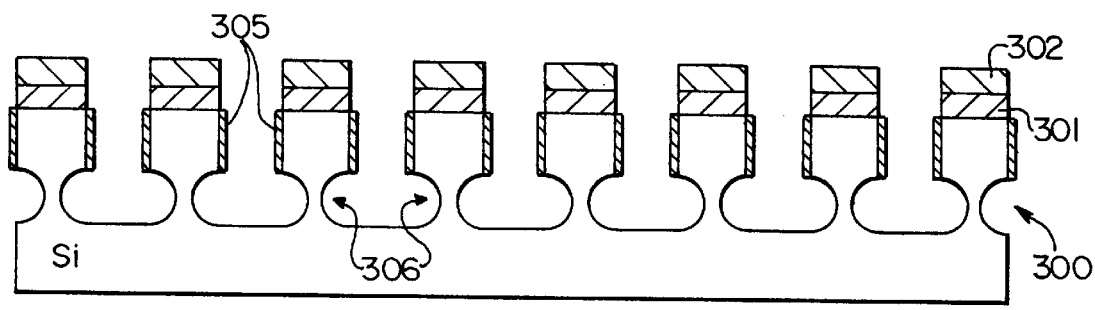
FIG. 3C shows a third step of isotropic etching the structure depicted in FIG. 3B to create thin foot regions 306 under each island.

FIG. 3C shows the structure of FIG. 3B after a step of isotropic etching, which creates the thin foot regions 306. The passivation films 305 act as masks during this step to prevent the sidewalls of the islands from being eroded. As explained previously, the pinch-off or erosion of the thin foot area as much as 80% of the initial width is allowable. Even erosion up to 95% is acceptable if the substrate doping exceeds $10^{17}$ cm$^{-3}$. The photoresist mask 302 and thin passivation layer 305 are removed afterwards with oxygen down-flow plasma and wet cleaning steps.

Figure 3D:
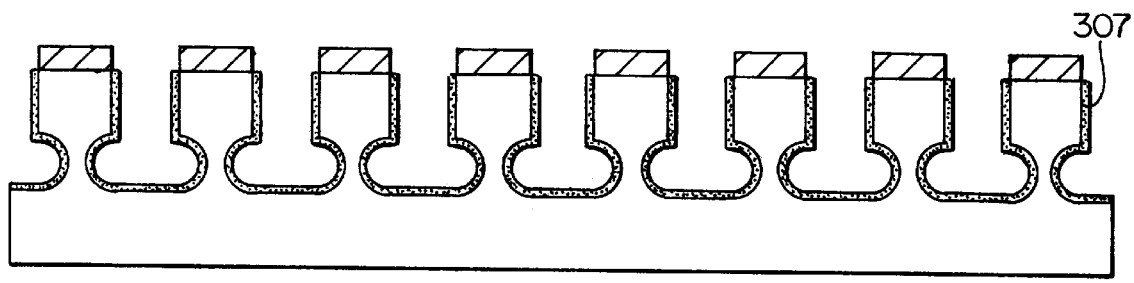
FIG. 3D shows a thermal oxidation step on the structure resulting from FIG. 3C after the photoresist and passivation layer removal. Thin thermal oxide grows on the silicon surfaces surrounding the thin foot regions and island sidewalls creating high quality silicon/oxide interface.

Next, as shown in FIG. 3D, a thermal oxidation step, for example, in dry oxygen at 1000 C for 5 minutes is performed on the substrate resulting from FIG. 3C, creating thin oxide layer 307 about 100 A thick over the thin foot regions. As explained previously, this thermal oxide layer 307 provides a superior interface quality assuring an excellent quality of the thin foot as a charge drain. Also, by adjusting the oxide thickness grown in this step, the thin foot width can be tailored.

Figure 3E:
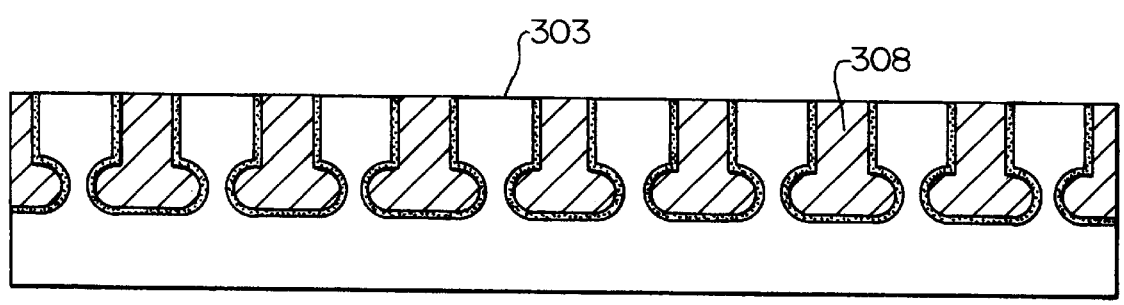
FIG. 3E shows the structure resulting from FIG. 3D after filling with CVD oxide 308 and planarization.

Finally, as shown in FIG. 3E, conventional filling and planarization steps are performed, creating trenches filled up to the silicon surface. The filling step can be accomplished by ordinary CVD oxide 308 deposition. The planarization is achieved by CMP using nitride layer 301 as a pad during polishing. After the polish, it is removed by hot phosphoric acid. The filled up trenches serve for STI of the devices. Thin foot regions 306 provide an electrical current path for the excess charge to be drained down to the silicon substrate 300. The pinching-off, i.e., incursion of low dielectric constant material, namely CVD oxide, under the silicon islands assures less electrical coupling between electronic devices to be formed on the silicon islands and substrate below.

The state-of-the-art planar device fabrication technology is directly applicable on this planar structure. DRAM memory cells may be constructed using known techniques on the silicon islands 303. Thus, DRAM arrays with high speed operation without any adverse effects due to the charge build-up and floating body effects as observed in the conventional SOI devices are realized on a part of the inexpensive bulk silicon substrate by adding only one extra step (i.e., isotropic etching) to conventional STI processes.

Application II: Multi-Layer SOI Circuits With Charge Drain

Reference will now be made to FIGS. 4A through 4G, which illustrate how multi-layer SOI device circuits with thin-foot charge drains can be constructed.

Figure 4A:
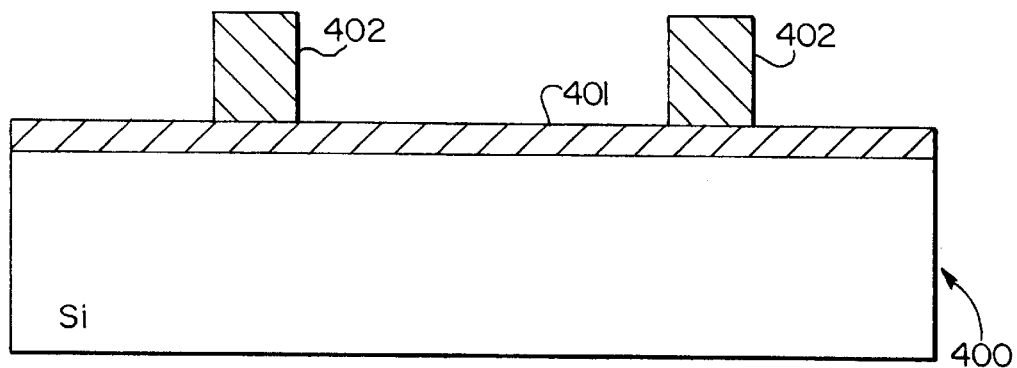
FIG. 4A shows first steps of forming a silicon nitride layer and photoresist masks to designate a plurality of silicon islands to create, for example, a multi-layer electronic circuit with improved device structure including thin foot charge drains.

As shown in FIG. 4A, a silicon nitride layer 401 is deposited on a silicon substrate 400, and photoresist film is applied and patterned to form designated mask pattern 402.

Figure 4B:
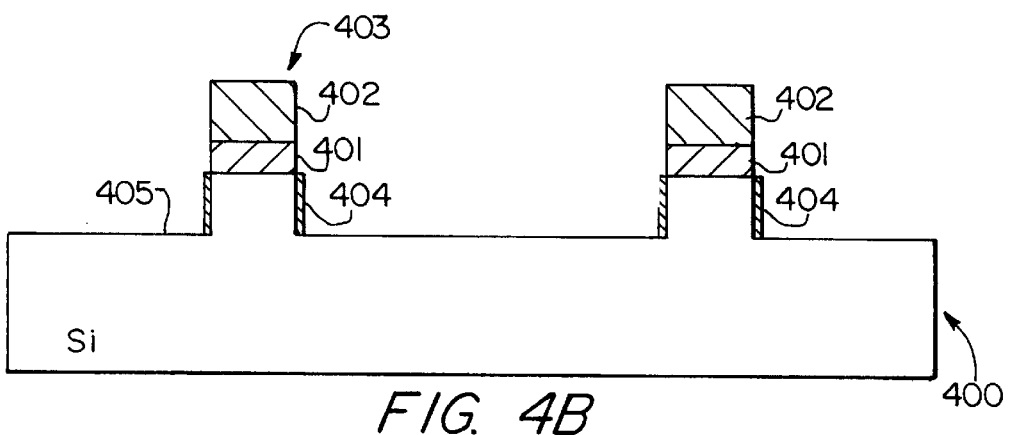
FIG. 4B shows a second step of an anisotropically etching the structure depicted in FIG. 4A leaving silicon islands 403 with the silicon nitride pad 401 and remaining photoresist patterns 402 on them. Thin passivation films 404 develop on the sidewalls of the islands.

Next, as shown in FIG. 4B, an RIE etching process is performed, leaving silicon islands 403, having passivation layer 404 on the sidewalls and remaining nitride layer 401 and photoresist mask 402 on the top of them. Relatively wide trenches 405 are formed. In this embodiment, the spacing between silicon islands of approximately 10 mm or less is desirable. However, in principle, there is no limitation on the separation between islands.

Figure 4C:
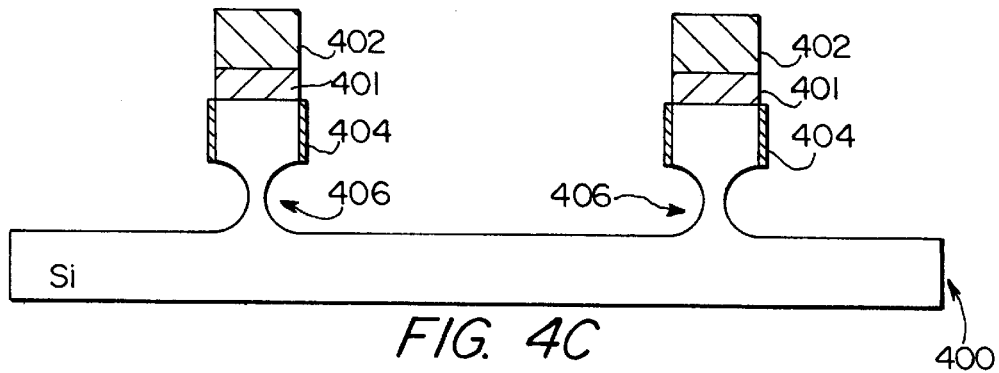
FIG. 4C shows a third step of isotropic etching the structure depicted in FIG. 4B to create thin foot regions 406 under each island.

FIG. 4C depicts the structure FIG. 4B after being subjected to an isotropic etching process. Thin foot regions 406 are formed beneath the islands 403. The bottom of the trenches 405 are also etched down. Since the RIE damaged layer at the bottom of the trenches 405 is removed, it is possible to form electronic devices on the bottom of the trenches 405. In this embodiment, the processes for their fabrication are omitted. However, it should be understood that it casts no limitation on the application of this invention.

Next, a thermal oxidation process is performed. The resulting oxide film 407 may be used as gate oxides for the devices to be formed at the bottom of the trenches. After necessary processing for device fabrication at the bottom of trenches, they are filled with CVD oxides 408 and planarized by CMP, resulting in the structure illustrated in FIG. 4D. The trenches 405 are filled up to the silicon surface. Nitride layer 401 on the silicon islands 403 is selectively removed by hot phosphoric acid treatment. A crystal silicon surface is exposed.

Figure 4D:
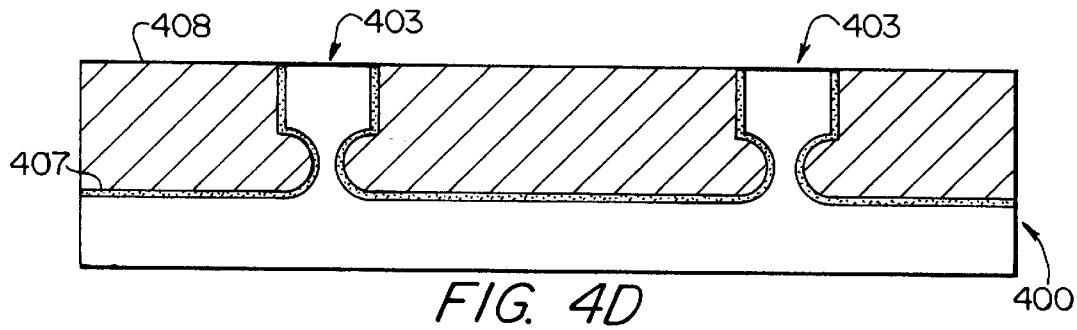
FIG. 4D shows a structure resulting from FIG. 4C after the photoresist and passivation layer removal, thermal oxidation, filling with CVD oxide and planarization.
Figure 4E:
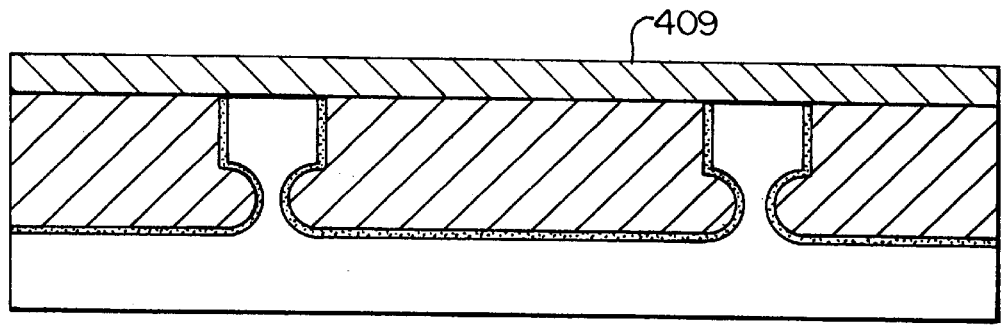
FIG. 4E shows an additional step of forming an amorphous silicon layer 409 on the structure depicted in FIG. 4D.

Thereafter, as shown in FIG. 4E, an amorphous silicon layer 409 is formed on the surface of the structure resulting from FIG. 4D so that portions of the bottom surface of the amorphous layer have direct contact with the top surface of crystal silicon of the islands 403. The layer is, for example, deposited at 500 C in the presence of silane gas. The thickness of the layer 409 may be 1000 A.

The resulting structure is further subjected to an annealing process, which causes crystallization of amorphous silicon layer 409 using the contacts to the top surfaces of the crystal silicon islands 403 as seeds for the epitaxial growth. The annealing process may be at 600 C in ambient nitrogen. There may be mismatching in crystallinity between two epitaxial growth phases initiated from different seeds, creating domain wall 409' in the middle of the trench 405. However, as explained later, it is not necessary that all of the amorphous layer becomes a single crystal.

Figure 4F:
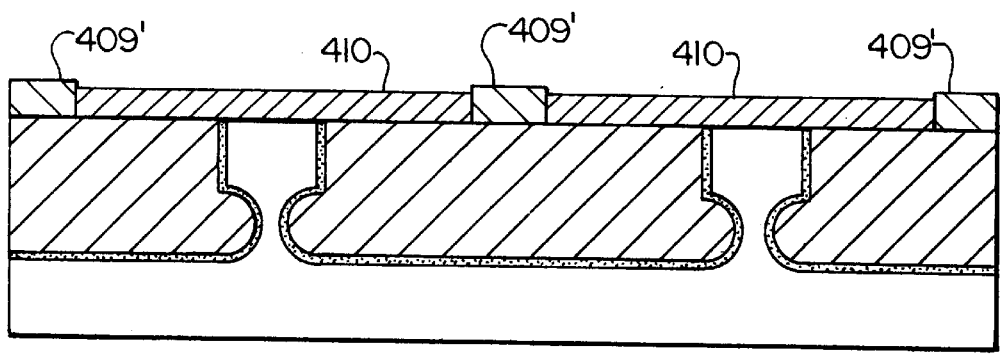
FIG. 4F shows a further step of annealing of the structure depicted in FIG. 4E to create crystal silicon plates 410.

A structure having crystallized silicon areas 410 as depicted in FIG. 4F is thus obtained. It should be noted that, for epitaxial growth of the amorphous layer 409, the larger the contact area to the seed crystal silicon is, the better the resulting crystal quality of the layer 410 becomes. On the other hand, if one uses a large seed area to grow an epitaxial layer, the resulting crystal silicon film 410 would have strong electrical coupling to the substrate.

From a crystal quality aspect, it is desirable to have a large contact to the silicon island, while faster operation of the devices to be constructed on the resulting layer 410 demands the smallest electrical coupling to the substrate. These apparently opposing requirements can be both fulfilled by employing the thin foot structure of the island 403. The islands whose top surfaces serve as seeds for the epitaxial growth of the layer 409 can have large areas without strong electrical coupling to the substrate because the pinching-off of the thin foot regions 406 reduces the electrical coupling. As explained earlier, an electrical contact to the substrate is required in order to drain excess charge generated during device operation, which would otherwise build up in the device body and inflict adverse effects on the device performance. Also, as discussed earlier, even a very thin foot suffices for the charge drain. Therefore, even if the top surface of islands 403 is large, one can pinch-off the feet of the islands substantially so that electrical coupling to the substrate is minimized.

Figure 4G:
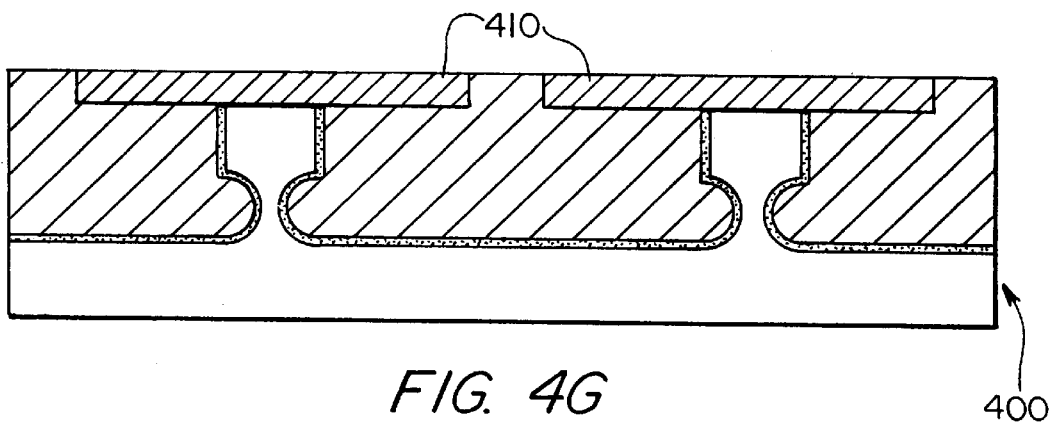
FIG. 4G shows a further step of shallow trench isolation on the structure of FIG. 4F.

Finally, as shown in FIG. 4G, domain wall 409' is removed by making use of nitride deposition on the structure resulting from FIG. 4F by CVD technique (as a CMP pad), photoresist application and patterning by lithography technique (to make an opening on the region above the domain wall 409'), and etching of the exposed portion of nitride film and the domain wall region 409' by RIE technique. The crystal areas 410 are now electrically isolated from each other. Conventional filling and planarization steps are performed, forming filled up gaps between crystal areas 410 with CVD oxide up to silicon surface. STI process of the epitaxial layer is completed. Of course, any other convenient way of STI process may be used. Because the domain wall 409' is thus eventually removed during this STI process, there is no need for crystallization of the entire amorphous layer 409 into a single crystal. Crystallization within an area where electronic devices are designed is sufficient.

The state-of-the-art planar device fabrication technology is directly applicable on this planar structure shown in the FIG. 4G. Now, high quality epitaxial silicon areas 410, resulting from wide contacts to the seed silicon surfaces, having thin foot charge drains, and being isolated each other by STI technique, are realized over the original active areas (where the original devices can be fabricated) of the inexpensive bulk silicon substrate, providing a structure for multi-level electronic circuit fabrication, thus allowing large latitude for circuit design (second level electronic device may overhang above lower level devices), without strong electrical coupling to the substrate, therefore ensuring fast operation of the devices, and without any adverse effects of the charge build-up and floating effects, by using an inevitably required process for the RIE damage removal (i.e., isotropic etching) also for the thin foot formation at the same time, thus with no extra step added.

Application III: Multi-layer SOI Circuits With Charge Drain

Reference will now be made to FIGS. 5A through 5D, which illustrate a variation on the process shown in FIG. 4A through 4G in which multiple layers of islands can be formed.

Figure 5A:
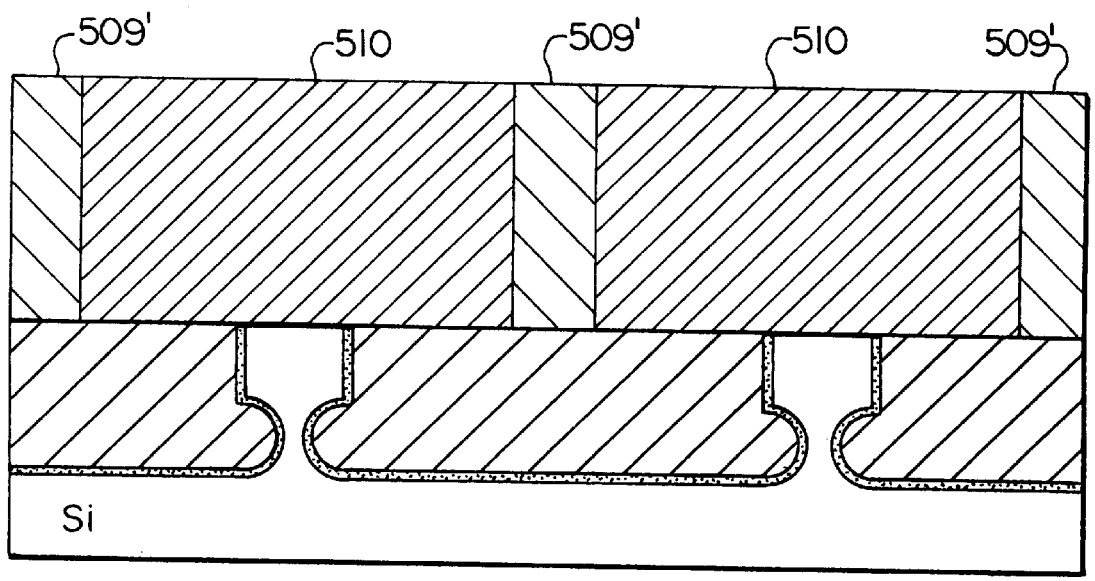
FIG. 5A shows a modified version of the steps depicted in FIG. 4E to 4G resulting in formation of thicker crystal silicon plates 510 in order to provide third or more levels for electronic circuitry.

As shown in FIG. 5A, a much thicker (e.g., 5000 A) layer of amorphous silicon 509 is applied to the structure resulting from FIG. 4D which, when annealed, crystallizes into thicker plates 510, leaving some domain walls 509'.

Figure 5B:
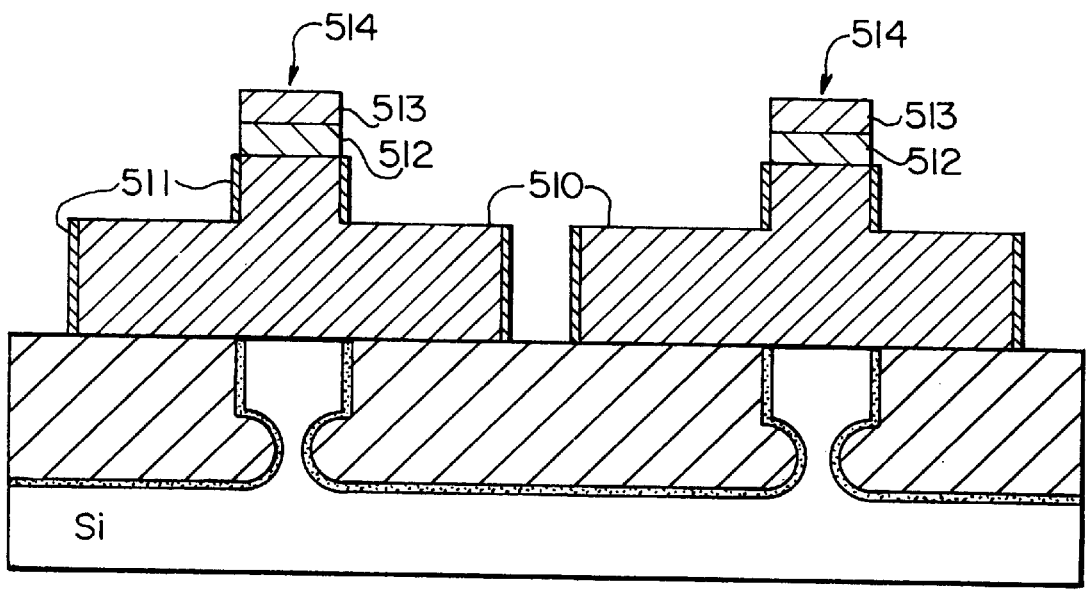
FIG. 5B shows formation of additional silicon islands 514 in a second layer above that in FIG. 5A.

Thereafter, a silicon nitride layer 512 and photoresist patterns are formed on the surface of the structure of FIG. 5A. The domain wall regions 509' are removed by RIE using the photoresist patterning as etching masks. The crystal plates 510 are isolated from each other. Further, after applying a photoresist film and patterning it to have RIE masks 513 on the surface of designated areas of the crystal plates 510, following the RIE step realizes new silicon islands 514 having nitride caps 512 and remaining photoresist masks 513 on them. Thin passivation layers 511 are also formed. A structure depicted in FIG. 5B is materialized.

Figure 5C:
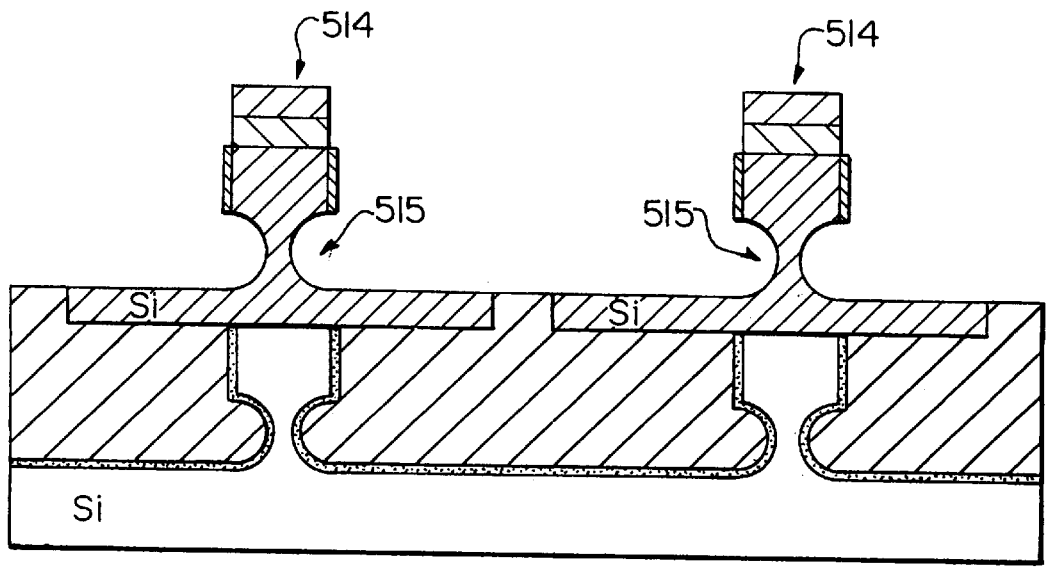
FIG. 5C shows an isotropic etching step to form thin foot regions 515 in the second level silicon layer.

Next, as shown in FIG. 5C, an isotropic etching is performed immediately after the RIE step. The passivation layers 511 formed in the RIE step protect the sidewalls of the silicon islands 514 and crystal plate 510. Thin foot regions 515 are formed under each silicon islands. At the same time, RIE damage incurred on the surface of the etched crystal surface of 510 is removed to create damage free silicon surface 510'. It is possible to form electronic devices on this new surface 510'. In this embodiment, we will omit to show the processes for their fabrication. However, it should be understood that it casts no limitation on the application of this invention.

Figure 5D:
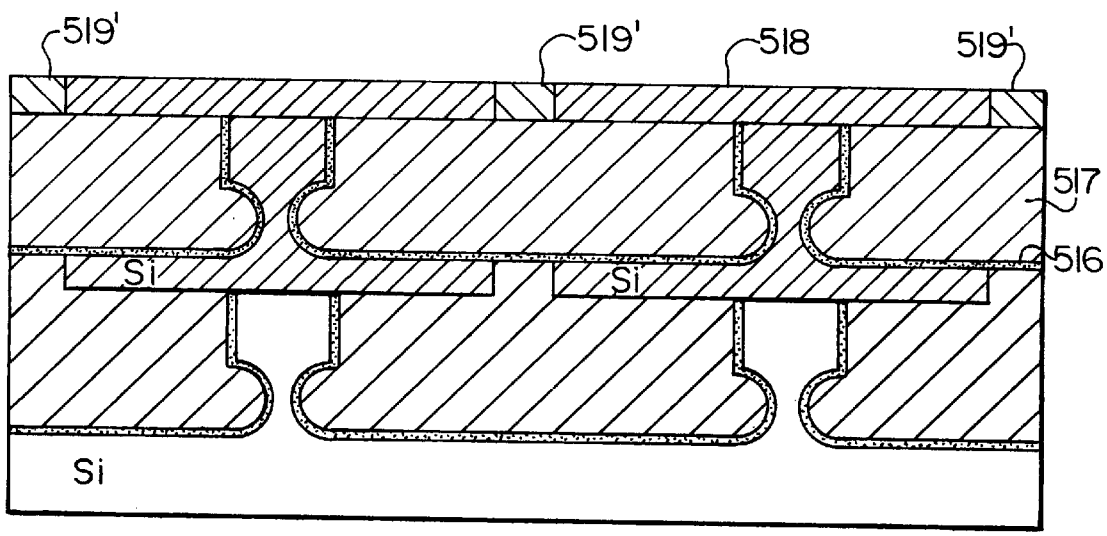
FIG. 5D shows a structure after the steps demonstrated with FIG. 4C through 4F are applied to that of the FIG. 5C.

Then, process steps explained with reference to the FIG. 4C through FIG. 4F are repeated on the structure resulting from FIG. 5C, forming a thermal oxide layer 516 which ensures smooth draining of the electric carrier through the thin foot region 515, a CVD oxide film 517 which fills up the peripheral area of the silicon islands 514, second crystal plates 518 which are made from amorphous layer deposited on the structure and successive epitaxial growth, and some domain wall region 519. The structure depicted in FIG. 5D is obtained. Finally, domain wall 519 is removed and the resulting gap are filled with CVD oxide up to the silicon surface. STI process of the second level epitaxial layer is completed.

The state-of-the-art planar device fabrication technology is directly applicable on this planar structure. Now, a structure with second level active areas on which the third level electronic circuit is to be constructed has been successfully realized keeping various advantages of the present invention explained with reference to the FIG. 4G. Obviously, further reiteration of the processes described so far results in an another silicon level.

SUMMARY

Thus has been described various methods of constructing improved devices which include a device structure having STI, reduced coupling to the substrate, and a thin foot charge drain on an inexpensive bulk silicon substrate without any adverse effects of the charge build-up and floating effects, and, furthermore, without any extra process steps added to the conventional STI technology except for the isotropic etching which could be performed immediately after the RIE step. They also include multi-level electronic circuits on high quality epitaxial silicon areas, resulting from wide contacts to the seed silicon surfaces, having thin foot charge drains, and being isolated from each other by STI technique, over the original active areas on an inexpensive bulk silicon substrate, without strong electrical coupling to the substrate, therefore ensuring fast operation of the devices, and without any adverse effects of the charge build-up and floating effects, by using an inevitably required process for the RIE damage removal (i.e., isotropic etching) also for the thin foot formation at the same time, thus with no extra step added.

It is apparent that a wide range of different working devices can be formed based on the invention without deviating from the spirit and scope of the invention. For example, although specific types of etching methods have been described, other type of etching are of course possible and are, in many cases, interchangeable with those disclosed herein. Although silicon has been described as the semiconductor material, the inventive principle may be practiced with other substances such as gallium arsenide. Moreover, it may be possible to practice the method of the present invention by using a different sequence of steps than that specifically described herein. It is therefore to be understood that the present invention is not limited only to the particular example described herein.

I claim:

1. A method of manufacturing a semiconductor device, comprising the steps of:

(1) forming a resist pattern over a semiconductor substrate to designate a plurality of islands;

(2) anisotropically etching the structure resulting from step (1) to form the plurality of designated islands from the semiconductor substrate;

(3) isotropically etching the structure resulting from step (2), using only a deposition film formed on the sides of the islands during said anisotropic etching step as a protective mask of the sides of the islands, and creating from the structure a plurality of thin foot regions each of which connects one of the plurality of islands formed in step (2) to the semiconductor substrate;

(4) removing the deposition film from the structure resulting from step (3); and (5) oxidizing the structure resulting from step (4) to form a thermal oxidation layer on the sides of the islands and the thin foot regions, while leaving the inner portion of the thin foot regions to be a non-oxidized portion which provides a conductive charge drain interface between each of the plurality of islands and the semiconductor substrate.

2. The method of claim 1, further comprising the step of controlling the width and resistance of each thin-foot region to satisfy the relation $R_{tf}*W<24$ k$\Omega\mu$m, where $R_{tf}$ is the resistance of each thin-foot region, and W is the half-width of each thin-foot region.

3. The method of claim 1, further comprising the steps of:

(6) filling voids between each of the plurality of islands with an insulator; and (7) planarizing the structure resulting from step (6).

4. The method of claim 1, wherein step (2) comprises the step of performing reactive ion etching (RIE).

5. The method of claim 1, wherein step (3) comprises the step of performing isotropic etching to a depth wherein each thin foot region has a width which is approximately 5% to 20% of the width of a corresponding island.

6. The method of claim 1, wherein step (1) comprises the step of forming a silicon nitride layer on the semiconductor substrate prior to forming the resist pattern.

7. The method of claim 1, further comprising the step of, prior to step (3), forming passivation areas on the sides of each island.

8. The method of claim 2, further comprising the step of forming an amorphous silicon layer on the structure resulting from step (7).

9. A method of manufacturing a silicon-on-insulator device, comprising the steps of:
   (1) forming a resist pattern over a silicon substrate to designate a plurality of silicon islands;
   (2) anisotropically etching the structure resulting from step (1) to form the plurality of designated silicon islands from the silicon substrate and forming thereby a passivation layer on the sides of the silicon islands;
   (3) performing isotropic etching, using only a deposition film formed on the sides of the islands during said anisotropic etching step as a protective mask of the sides of the islands, on the structure resulting from step (3) to a depth which creates a thin foot region beneath each of the silicon islands formed in step (2); and
   (4) removing the deposition film from the structure resulting from step (3); and
   (5) oxidizing the structure resulting from step (4) to form an oxidation layer on the sides of the islands and the thin foot regions, while leaving the inner portion of the thin foot regions to be a non-oxidized portion.

10. The method of claim 9, wherein step (3) comprises the step of etching to a depth such that each thin foot region has a width of approximately 5% of the width of each silicon island.

11. The method of claim 9, further comprising the steps of:.
   (6) filling voids between the islands resulting from the structure of step (5) with an insulator; and
   (7) planarizing the structure resulting from step (6).

12. The method of claim 11, further comprising the steps of:
   (8) forming an amorphous silicon layer on the structure resulting from step (7); and
   (9) annealing the amorphous silicon layer to create crystal silicon plates over the silicon islands.

13. The method of claim 12, further comprising the step of removing portions of the amorphous silicon layer between the crystal silicon plates.

14. The method of claim 12, further comprising the steps of:
   (10) forming a second set of resist patterns over the crystal silicon plates to designate a second set of silicon islands; and
   (11) performing an additional etching step using the second set of resist patterns and creating therefrom a second set of silicon islands.

15. The method of claim 14, further comprising the step of:
   (12) performing a second isotropic etching step and creating therefrom thin foot regions beneath each of the second set of silicon islands.

16. The method of claim 15, further comprising the steps of:
   (13) filling voids between the second set of silicon islands with an insulator material; and
   (14) planarizing the structure resulting from step (13).

17. A method of manufacturing a semiconductor device, comprising the steps of:
   forming a resist pattern over a semiconductor substrate to designate a plurality of islands;
   anisotropically etching the structure, resulting from said forming step, to form the plurality of designated islands from the semiconductor substrate;
   isotropically etching the structure resulting from said anisotropically etching step, using only a deposition film formed on the sides of the islands in said anisotropically etching step as a protective mask of the sides of the islands, and stopping said isotropically etching step thereby leaving a plurality of thin foot regions each of which connects one of the plurality of islands formed in said anisotropically etching step to the semiconductor substrate;
   oxidizing the structure resulting from said removing step to form a thermal oxidation layer on the sides of the islands and the thin foot regions, said oxidizing step being controlled so as to leave the inner portion of the thin foot regions to be a non-oxidized portion which provides a conductive charge drain interface between each of the plurality of islands and the semiconductor substrate.

18. The method of claim 17, further comprising the step of removing the deposition film from the structure resulting from said isotropically etching step.

19. The method of claim 17, further comprising the steps of:
   filing voids between each of the plurality of islands with an insulator; and
   planarizing the structure resulting from said filing step.

* * * * *